(12) United States Patent
Choi

(10) Patent No.: US 12,283,331 B2
(45) Date of Patent: Apr. 22, 2025

(54) TEST CIRCUIT FOR DETECTING WORD LINE DEFECT AND SEMICONDUCTOR APPARATUS INCLUDING THE SAME

(71) Applicant: SK hynix Inc., Icheon-si (KR)

(72) Inventor: Suk Hwan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 163 days.

(21) Appl. No.: 18/100,969

(22) Filed: Jan. 24, 2023

(65) Prior Publication Data

US 2024/0120014 A1 Apr. 11, 2024

(30) Foreign Application Priority Data

Oct. 11, 2022 (KR) .................... 10-2022-0129837

(51) Int. Cl.
*G11C 29/00* (2006.01)
*G11C 29/12* (2006.01)
*G11C 29/18* (2006.01)
*G11C 29/46* (2006.01)

(52) U.S. Cl.
CPC ........ *G11C 29/12005* (2013.01); *G11C 29/18* (2013.01); *G11C 29/46* (2013.01); *G11C 2029/1202* (2013.01); *G11C 2029/1802* (2013.01)

(58) Field of Classification Search
CPC ... G11C 29/12005; G11C 29/18; G11C 29/46; G11C 2029/1202; G11C 2029/1802; G11C 2029/5006; G11C 5/147; G11C 8/10

See application file for complete search history.

(56) References Cited

U.S. PATENT DOCUMENTS

| 6,671,836 B1* | 12/2003 | Lai ................. G11C 29/48 714/718 |
| 8,045,394 B2 | 10/2011 | Do |
| 2011/0102006 A1 | 5/2011 | Choi et al. |
| 2011/0116332 A1* | 5/2011 | Naka ............ G11C 29/12005 365/201 |
| 2012/0008410 A1* | 1/2012 | Huynh ............. G11C 29/028 365/185.21 |
| 2015/0071000 A1* | 3/2015 | Namai ........... G11C 29/12005 365/201 |
| 2019/0006019 A1* | 1/2019 | Wang ............... G11C 16/08 |
| 2022/0051741 A1* | 2/2022 | Choi ............. G11C 29/12015 |
| 2022/0366990 A1* | 11/2022 | Prakash ............. G11C 16/26 |

FOREIGN PATENT DOCUMENTS

JP 2011165259 A * 8/2011 ............ G11C 29/02

* cited by examiner

*Primary Examiner* — Mushfique Siddique
(74) *Attorney, Agent, or Firm* — WILLIAM PARK & ASSOCIATES LTD.

(57) ABSTRACT

The present technology includes: a current mirror configured to apply a test current that is generated by a test voltage to a selected word line, among a plurality of word lines, and to generate a copy current by copying the test current; a comparison circuit configured to compare at least one reference current with the copy current to generate a comparison result signal; and a test control circuit configured to perform a first noise control mode that charges unselected word lines, among the plurality of word lines, with electric charges, in response to a test mode signal and floats the unselected word lines.

19 Claims, 11 Drawing Sheets

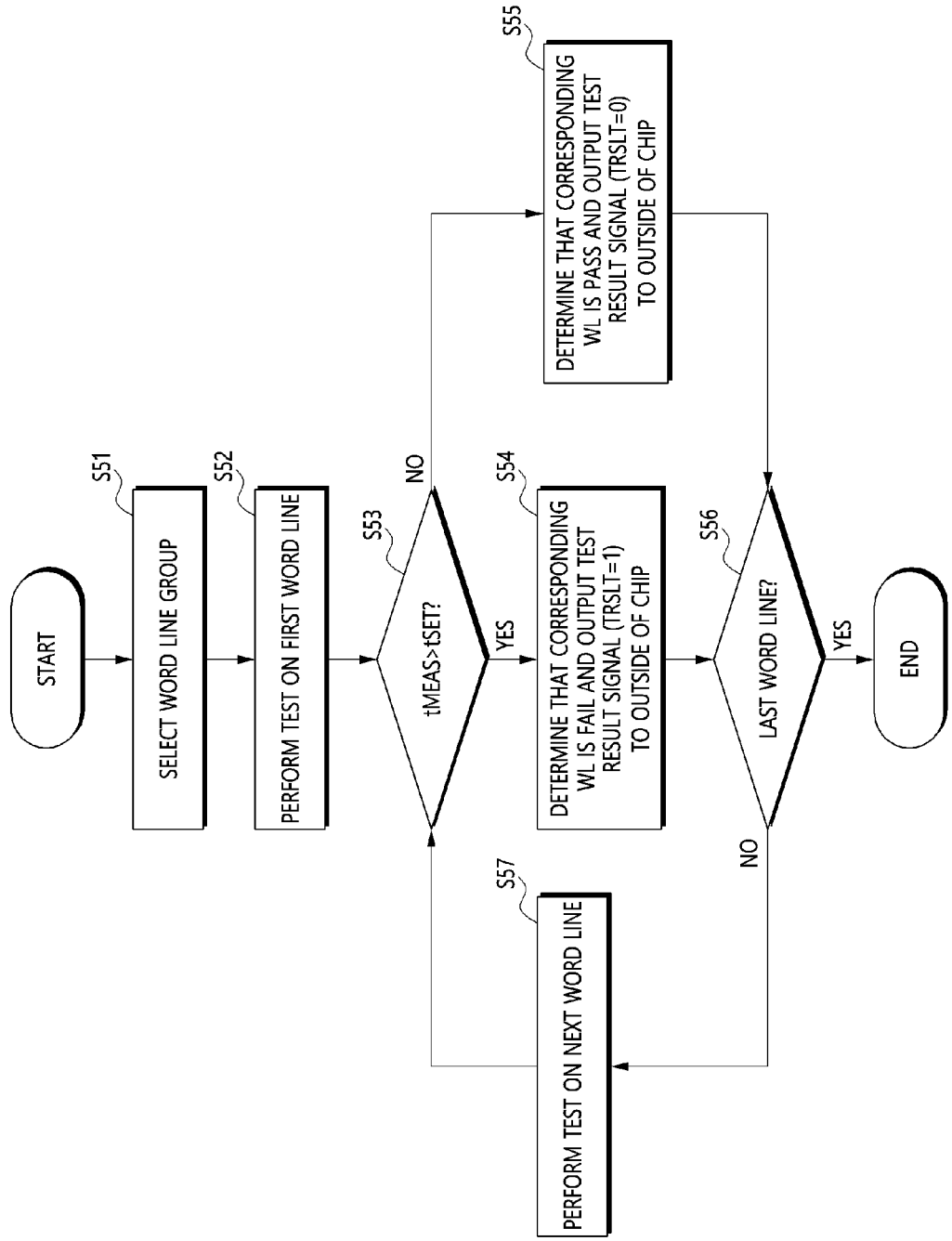

TEST CIRCUIT FOR DETECTING WORD LINE DEFECT AND SEMICONDUCTOR APPARATUS INCLUDING THE SAME

CROSS-REFERENCES TO RELATED APPLICATION

The present application claims priority under 35 U.S.C. § 119(a) to Korean application number 10-2022-0129837, filed on Oct. 11, 2022, in the Korean Intellectual Property Office, which is incorporated herein by reference in its entirety.

BACKGROUND

1. Technical Field

The present disclosure relates to a semiconductor circuit, and particularly, to a test circuit and a semiconductor apparatus including the same.

2. Related Art

A semiconductor apparatus includes various test circuits for detecting internal defects. As an example of one of the various test circuits, a test circuit for detecting a defect in a word line is included.

The test circuit of the semiconductor apparatus uses a time measurement method as a method of measuring a defect in a word line, and provides test equipment connected to the semiconductor apparatus with data corresponding to time measured by the time measurement method. The test equipment determines a pass/fail by comparing the data provided by the semiconductor apparatus with an internal reference time.

SUMMARY

A word line test circuit in accordance with an embodiment of the present disclosure may include: a current mirror configured to apply a test current that is generated by a test voltage to a selected word line, among a plurality of word lines, and to generate a copy current by copying the test current; a comparison circuit configured to compare at least one reference current with the copy current to generate a comparison result signal; and a test control circuit configured to perform a first noise control mode that charges unselected word lines, among the plurality of word lines, with electric charges, in response to a test mode signal and floats the unselected word lines.

A semiconductor apparatus in accordance with an embodiment of the present disclosure may include: a memory cell array; an address decoder connected to the memory cell array through a plurality of word lines and configured to selectively activate the plurality of word lines according to an address signal; a voltage generator configured to generate a plurality of source voltages for an operation of the semiconductor apparatus; and a test circuit configured to perform a word line test that compares a first reference current and a second reference current with a copy current that is generated by applying a test current that is generated by a test voltage to a selected word line, among the plurality of word lines, and configured to perform at least one of a first noise control mode, a second noise control mode, a third noise control mode, a first test result output mode, and a second test result output mode during the word line test.

BRIEF DESCRIPTION OF THE DRAWINGS

FIG. 11 is a flowchart illustrating a second test result output mode in accordance with embodiments of the present disclosure.

DETAILED DESCRIPTION

Hereinafter, embodiments of the present disclosure will be described in more detail with reference to the accompanying drawings.

Various embodiments are directed to providing a word line test circuit capable of reducing test performance degradation due to noise and a semiconductor apparatus including the same.

Various embodiments are directed to providing a word line test circuit capable of reducing test time and a semiconductor apparatus including the same.

Figure 1:
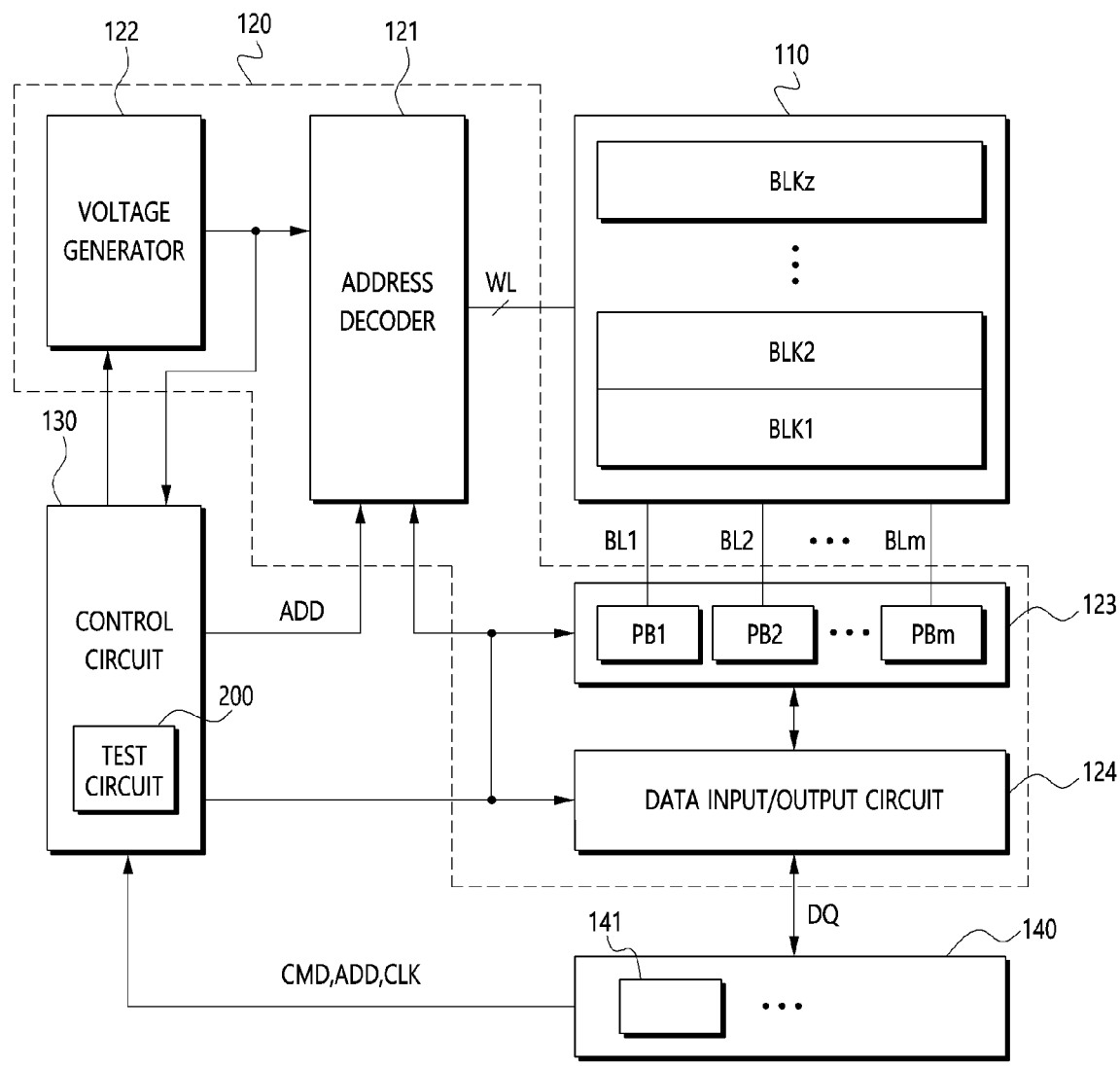
FIG. 1 is a diagram illustrating the configuration of a semiconductor apparatus 100 in accordance with an embodiment of the present disclosure.

FIG. 1 is a diagram illustrating the configuration of a semiconductor apparatus 100 in accordance with an embodiment of the present disclosure.

Referring to FIG. 1, the semiconductor apparatus 100 may include a memory cell array 110, a peripheral circuit 120, a control circuit 130, and an input/output pad unit 140. The peripheral circuit 120 may include an address decoder 121, a voltage generator 122, a read/write circuit 123, and a data input/output circuit 124.

The input/output pad unit 140 may include a plurality of pads 141 for receiving a command CMD, addresses ADD, and a clock signal CLK, and inputting/outputting data DQ.

The memory cell array 110 may be connected to the address decoder 121 through word lines WL and connected to the read/write circuit 123 through bit lines BL1 to BLm. The memory cell array 110 may include a plurality of memory blocks BLK1 to BLKz. The plurality of memory blocks BLK1 to BLKz may be connected to the address decoder 121 through the word lines WL. The plurality of memory blocks BLK1 to BLKz may be connected to the read/write circuit 123 through the bit lines BL1 to BLm. Each of the plurality of memory blocks BLK1 to BLKz may include a plurality of memory cells. The plurality of memory cells may be nonvolatile memory cells. Each memory block included in the memory cell array 110 may include a plurality of pages. Among the plurality of memory cells, memory cells that are connected to substantially the same word line may be defined as one page. Normal data, that is, data that are transmitted and received by a normal read operation and a normal write operation may be stored in the plurality of memory blocks BLK1 to BLKz.

The memory cells of the semiconductor apparatus 100 may include a single level cell (SLC) that stores one data bit, a multilevel cell (MLC) that stores two data bits, a triple level cell (TLC) that may store three data bits, or a quad level cell (QLC) that stores four data bits.

The peripheral circuit 120 may drive the memory cell array 110 to perform a program operation, a read operation, and an erase operation.

The address decoder 121 may be connected to the memory cell array 110 through the word lines WL. The address decoder 121 may be configured to operate in response to the control circuit 130. The address decoder 121 may receive the addresses ADD from the control circuit 130.

The address decoder 121 may decode a block address, among the addresses ADD. The address decoder 121 may select at least one memory block, among the memory blocks BLK1 to BLKz, according to the decoded block address. The address decoder 121 is configured to decode a row address, among the received addresses ADD. The address decoder 121 may select at least one word line of the selected memory block by applying voltages that are provided from the voltage generator 122 to the at least one word line WL according to the decoded row address.

The address decoder 121 may perform a program operation by applying a program voltage to a selected word line and applying a pass voltage having a lower level than the program voltage to unselected word lines.

The address decoder 121 may perform a read operation by applying a read voltage to the selected word line and applying a pass voltage having a higher level than the read voltage to the unselected word lines.

An erase operation of the semiconductor apparatus 100 may be performed in units of memory blocks. The address decoder 121 may decode a block address and select one memory block according to the decoded block address. The address decoder 121 may perform an erase operation by applying a ground voltage to a word line that is input to the selected memory block and applying an erase voltage to a bulk region in which the selected memory block is formed.

The voltage generator 122 may generate various voltages that are necessary for the operation of the semiconductor apparatus 100, for example, a read voltage, a pass voltage, a program voltage, and an erase voltage, under the control of the control circuit 130, and may provide the generated voltages to the address decoder 121.

The read/write circuit 123 may include a plurality of page buffers, for example, a plurality of page buffers PB1 to PBm. The plurality of page buffers PB1 to PBm may be connected to the memory cell array 110 through first to $m^{th}$ bit lines BL1 to BLm, respectively. The plurality of page buffers PB1 to PBm may operate in response to control signals that are received from the control circuit 130.

The plurality of page buffers PB1 to PBm may perform data communication with the data input/output circuit 124. The plurality of page buffers PB1 to PBm may perform a program operation by receiving data to be stored through the data input/output circuit 124 and data lines DL and transferring the data to the memory cell array 110. The read/write circuit 123 may perform a read operation by reading data from the memory cells of a selected page through the bit lines BL and outputting the read data to the data input/output circuit 124. The read/write circuit 123 may perform an erase operation by floating the bit lines BL.

The data input/output circuit 124 may be connected between the plurality of page buffers PB1 to PBm and the input/output pad unit 140. The data input/output circuit 124 may perform data input and output operations in response to control signals that are received from the control circuit 130. During a read operation, the data input/output circuit 124 may output data, which are transferred from the plurality of memory blocks BLK1 to BLKz via the plurality of page buffers PB1 to PBm, to the control circuit 130 through the input/output pad unit 140. During a write operation, the data input/output circuit 124 may transfer data that are input from the control circuit 130 through the input/output pad unit 140 to the plurality of page buffers PB1 to PBm. During a state information read operation, the data input/output circuit 124 may output state information, which is transferred from the control circuit 130, to an external device that is outside the semiconductor apparatus 100, such as a memory controller, a host, or test equipment, through the input/output pad unit 140.

The control circuit 130 may be connected to the address decoder 121, the voltage generator 122, the read/write circuit 123, the data input/output circuit 124, and the input/output pad unit 140. The control circuit 130 may receive the command CMD, the addresses ADD, and the clock signal CLK through the input/output pad unit 140. The control circuit 130 may include a test circuit 200. The embodiment of the present disclosure is merely an example in which the test circuit 200 is included in the control circuit 130, and the test circuit 200 may also be configured in a separate region. The test circuit 200 may be configured to generate a test result by testing a resistive defect in a signal line to be tested, for example, a word line. Hereinafter, an operation that tests a word line defect will be referred to as a word line test.

The test circuit 200 may be configured to perform a word line test that applies a current that is generated by a test voltage to a word line that is selected for a test and generates a test result by comparing a value of the current with one or more reference currents.

The test circuit 200 may be configured to simultaneously perform one or more of a first noise control mode, a second noise control mode, a third noise control mode, a first test result output mode, and a second test result output mode during the word line test. The first noise control mode may be an operation that charges unselected word lines, which are adjacent to selected word lines, with electric charges and then floats the unselected word lines. Noise caused by the unselected word lines may be minimized by the first noise control mode. The second noise control mode may be performed by an operation that detects a voltage source having the least noise among a plurality of voltage sources and selects the detected voltage source as a test voltage. Noise caused by the test voltage may be minimized by the second noise control mode. The third noise control mode may be performed by an operation that sets, as a value with the least noise, the amount of each of the reference currents compared with the current that is generated by the test voltage. Noise caused by the reference current may be minimized by the third noise control mode. The first test result output mode may be performed by an operation that performs a word line test on a word line group that is selected from all word lines and outputs only a single-bit test result signal that defines a pass/fail for the word line group. Test time may be minimized by the first test result output mode. The second test result output 1o mode may be performed by an operation that performs a word line test on all the word lines and outputs only a single-bit test result signal that defines a pass/fail for each word line. Test reliability may be improved by the second test result output mode compared to the first test result output mode.

The test circuit 200 may be configured to perform a word line test by comparing a copy current that is generated by applying a test current that is generated by the test voltage to a selected word line with a first reference current and a second reference current, and to perform at least one of the first noise control mode, the second noise control mode, the third noise control mode, the first test result output mode, and the second test result output mode during the word line test.

The test circuit 200 may be configured to deactivate the voltage generator for generating the plurality of voltage sources after charging the unselected word lines with electric charges.

The test circuit 200 may be configured to perform the second noise control mode that repeats a test on any one of the plurality of word lines, based on each of the plurality of voltage sources, a preset number of times to detect measurement variation values, detects a voltage source corresponding to the smallest detected measurement variation values, and selects the detected voltage source as the test voltage.

The test circuit 200 may be configured to perform the third noise control mode that sets the amount of the first reference current as the amount of current at the time of final pass determination when a fail occurs as a result of performing a test on some of the plurality of word lines while varying the amount of the first reference current in a state in which the second reference current is set as an arbitrary value and sets the amount of the second reference current as the amount of current at the time of final pass determination when a fail occurs as a result of performing a test on some of the plurality of word lines while varying the amount of the second reference current in a state in which the first reference current is set as an arbitrary value.

The test circuit 200 may include a current mirror configured to apply the test current that is generated by the test voltage to the selected word line and to generate the copy current by copying the test current, a multiplexer configured to select one of the plurality of voltage sources and output the selected voltage source to the current mirror, a reference current generator configured to generate the first reference current and the second reference current, a comparison circuit configured to generate a comparison result signal by comparing the copy current with the first reference current and the second reference current, a switching circuit connected between the plurality of voltage sources, the current mirror, and the plurality of word lines, and a test control circuit configured to control the multiplexer, the reference current generator, and the switching circuit to match at least one of the word line test, the first noise control mode, the second noise control mode, the third noise control mode, the first test result output mode, and the second test result output mode in response to a test mode signal.

The test circuit 200 may be configured in various forms including FIG. 3, FIG. 5, and FIG. 7 to be described below.

Figure 2:
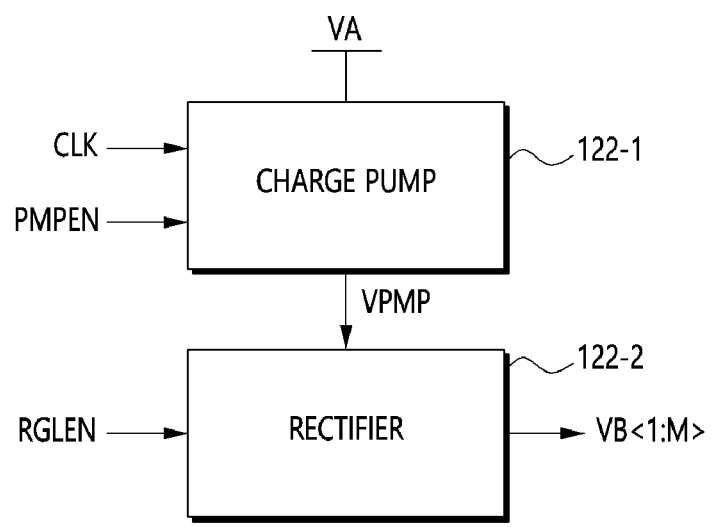
FIG. 2 is a diagram illustrating the configuration of a voltage generator 122 in FIG. 1.

FIG. 2 is a diagram illustrating the configuration of the voltage generator 122 in FIG. 1.

Referring to FIG. 2, the voltage generator 122 may include a charge pump 122-1 and a rectifier 122-2.

The charge pump 122-1 may generate a pumping voltage VPMP in response to a charge pump enable signal PMPEN and a clock signal CLK. When the charge pump enable signal PMPEN is activated, the charge pump 122-1 may generate the pumping voltage VPMP by performing a pumping operation by using a first voltage VA in response to the clock signal CLK. The first voltage VA may be a power supply voltage. The charge pump 122-1 may cause noise during its basic operating characteristics, that is, during the pumping operation process. Particularly, as the charge pump 122-1 operates based on the clock signal (CLK), the noise from the charge pump 122-1 may intensify. As a result, the pumping voltage VPMP may include noise.

The rectifier 122-2 may generate a plurality of second voltages VB<1:M> in response to a rectifier enable signal RGLEN and the pumping voltage VPMP. When the rectifier enable signal RGLEN is activated, the rectifier 122-2 may generate the plurality of second voltages VB<1:M> by rectifying the pumping voltage VPMP. The plurality of second voltages VB<1:M> may have different voltage levels. The plurality of second voltages VB<1:M> may be used as a read voltage, a pass voltage, a program voltage, and an erase voltage. The first voltage VA and the plurality of second voltages VB<1:M> may be referred to as a plurality of voltage sources, and one of them may be selected as the test voltage.

Figure 3:
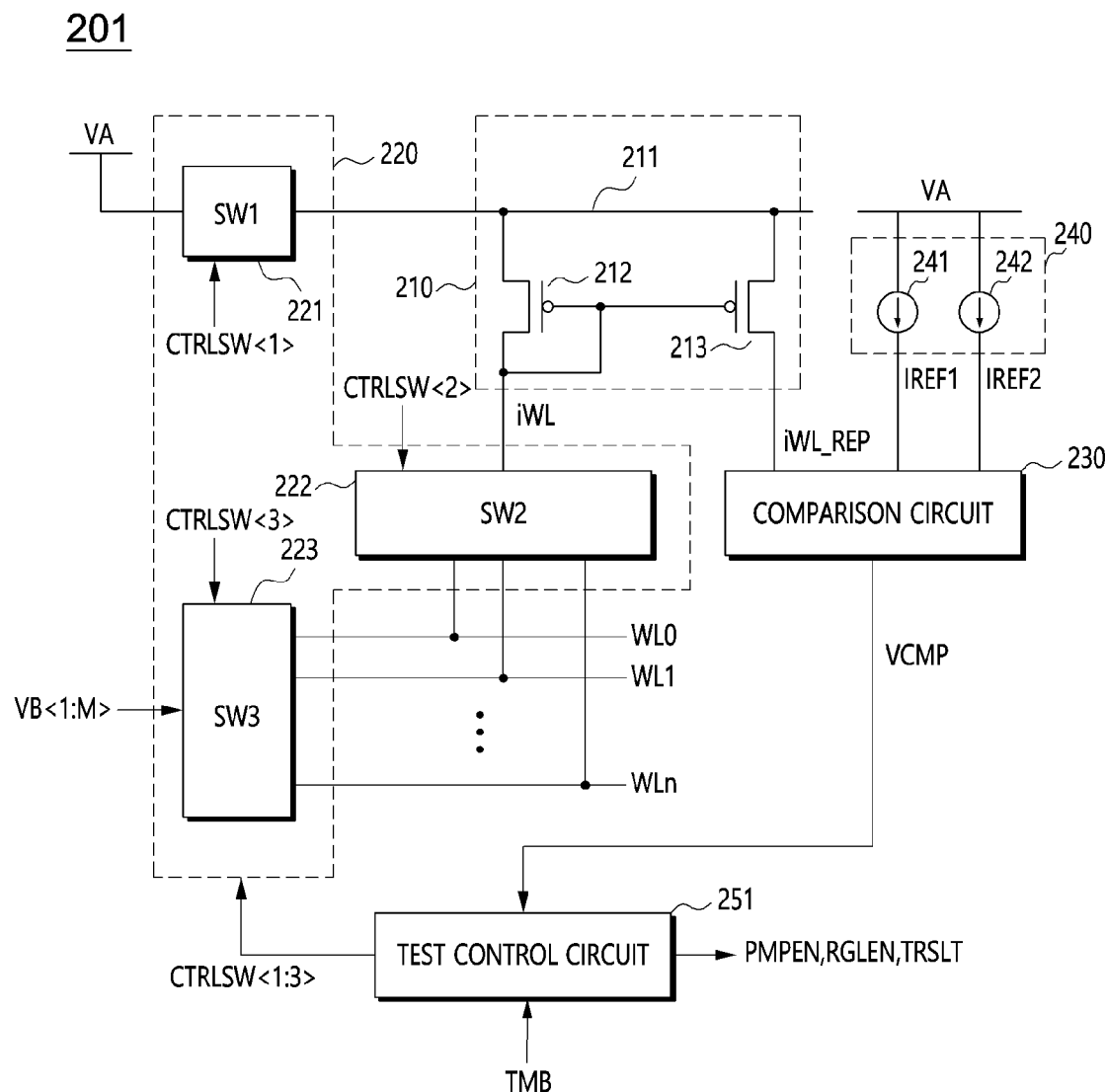
FIG. 3 is a diagram illustrating the configuration of a test circuit 201 in accordance with an embodiment of the present disclosure.

FIG. 3 is a diagram illustrating the configuration of a test circuit 201 in accordance with an embodiment of the present disclosure.

Referring to FIG. 3, the test circuit 201 may include a current mirror 210, a switching circuit 220, a comparison circuit 230, a reference current generator 240, and a test control circuit 251.

The current mirror 210 may be configured to apply a test current iWL that is generated by a test voltage to a selected word line, among a plurality of signal lines, for example, a plurality of word lines WL<0:n> and may be configured to generate a copy current iWL_REP by copying the test current iWL. The current mirror 210 may include a first transistor 212 and a second transistor 213. The first transistor 212 may have a source terminal that is connected to a power line 211 and a gate terminal that is connected to its own drain terminal. The second transistor 213 may have a source terminal that is connected to the power supply line 211 and a gate terminal that is connected to the gate terminal of the first transistor 212.

The switching circuit 220 may be connected between the plurality of voltage sources, the current mirror 210, and the plurality of word lines WL<0:n>. The switching circuit 220 may be configured to perform an operation that applies the first voltage VA, which is one of the plurality of voltage sources, to the current mirror 210 as the test voltage in response to a plurality of switching control signals CTRLSW<1:3>, an operation that applies the test current iWL to the selected word line, an operation that applies at least one of the plurality of second voltages VB<1:M> to unselected word lines, and an operation that floats the unselected word lines. The switching circuit 220 may include a first switching unit 221 (SW1), a second switching unit 222 (SW2), and a third switching unit 223 (SW3). The first switching unit 221 may apply a voltage source, that is, the first voltage VA, to the current mirror 210 as the test voltage in response to an activation of a first switching control signal CTRLSW<1> and may block the application of the first voltage VA to the current mirror 210 in response to a deactivation of the first switching control signal CTRLSW<1>. The second switching unit 222 may apply the test current iWL to the selected word line in response to an activation of a second switching control signal CTRLSW<2>. The third switching unit 223 may apply at least one of the plurality of second voltages VB<1:M> to the unselected word lines in response to an activation of a third switching control signal CTRLSW<3> and may float the unselected word lines in response to a deactivation of the third switching control signal CTRLSW<3>.

The comparison circuit 230 may generate a comparison result signal VCMP by comparing the copy current iWL_REP with one or more reference currents, for example, a first reference current IREF1 and a second reference current IREF2. The comparison circuit 230 may output, as the comparison result signal VCMP, a period signal 1o corresponding to the time at which the amount of the copy current iWL_REP is included between the first reference current IREF1 and the second reference current IREF2.

The reference current generator 240 may generate one or more reference currents, for example, the first reference current IREF1 and the second reference current IREF2, according to the first voltage VA. The reference current generator 240 may include a first current source 241 and a second current source 242. The first current source 241 may generate the first reference current IREF1 according to the first voltage VA. The first current source 241 may cause the first reference current IREF1 to substantially maintain a set amount of current. The second current source 242 may generate the second reference current IREF2 according to the first voltage VA. The second current source 242 may cause the second reference current IREF2 to substantially maintain a current amount that is different from that of the first reference current IREF1.

In response to a test mode signal TMB, the test control circuit 251 may generate control signals to match the first noise control mode, that is, an operation that charges the unselected word lines, which are adjacent to the selected word lines, with electric charges and then floats the unselected word lines. The control signals that are generated by the test control circuit 251 may include the plurality of switching control signals CTRLSW<1:3>, the charge pump enable signal PMPEN, and the rectifier enable signal RGLEN. The test control circuit 251 may convert the comparison result signal VCMP into a data form and output the converted signal as a test result signal TRSLT. The test control circuit 251 may be implemented as software and/or hardware including a time to digital converter TDC for converting the comparison result signal VCMP into a digital form.

Figure 4:
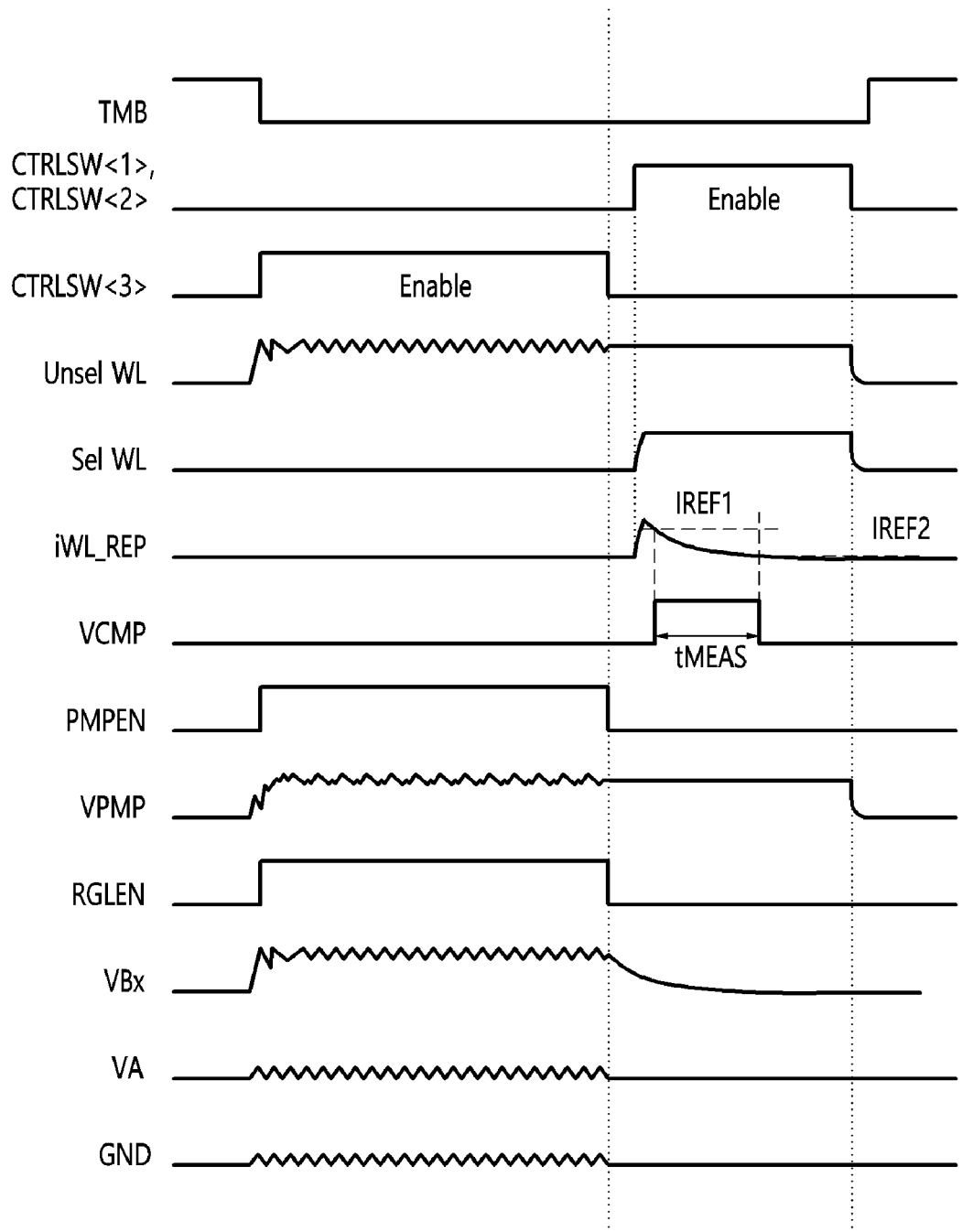
FIG. 4 is a timing diagram illustrating a word line test operation to which a first noise control mode of the test circuit 201 in accordance with an embodiment of the present disclosure is applied.

FIG. 4 is a timing diagram illustrating a word line test operation to which the first noise control mode of the test circuit 201 in accordance with an embodiment of the present disclosure is applied.

Hereinafter, the operation of the test circuit 201 will be described with reference to FIG. 3 and FIG. 4.

During an activation period of the test mode signal TMB, that is, a low level period, the semiconductor device 100 may enter a test mode.

As the test mode signal TMB is activated, the test control circuit 251 may substantially maintain the first switching control signal CTRLSW1 and the second switching control signal CTRLSW2 in a deactivated state and may activate the third switching control signal CTRLSW3, the charge pump enable signal PMPEN, and the rectifier enable signal RGLEN. Accordingly, a selected word line Sel WL may be substantially maintained at a low level, and unselected word lines Unsel WL may be charged with electric charges by at least one of the plurality of second voltages VB<1:M>. Since the charge pump 122-1 and the rectifier 122-2 that operate as the charge pump enable signal PMPEN and the rectifier enable signal RGLEN are activated, noise from the pumping voltage VPMP and the first voltage VA may be generated as described above, and the voltage levels of the plurality of second voltages VB<1:M> and the unselected word lines Unsel WL may also include noise.

Then, the test control circuit 251 may deactivate the third switching control signal CTRLSW3, the charge pump enable signal PMPEN, and the charge pump enable signal PMPEN after a set time so that the unselected word lines Unsel WL are charged with electric charges to a desired level and then may activate the first switching control signal CTRLSW1 and the second switching control signal CTRLSW2 with a predetermined time difference.

Accordingly, after completing the first noise control mode in which the unselected word lines Unsel WL are charged with electric charges and then floated, the test control circuit 251 may perform a word line test on the selected word line Sel WL and output a period signal tMEAS that is measured through the word line test as the comparison result signal VCMP. In a state in which the unselected word lines Unsel WL are floated, the charge pump 122-1 and the rectifier 122-2 may be deactivated, and thus, noise from the unselected word lines Unsel WL and the selected word line Sel WL may be removed, and the word line test may be performed, which makes it possible to improve test reliability.

Figure 5:
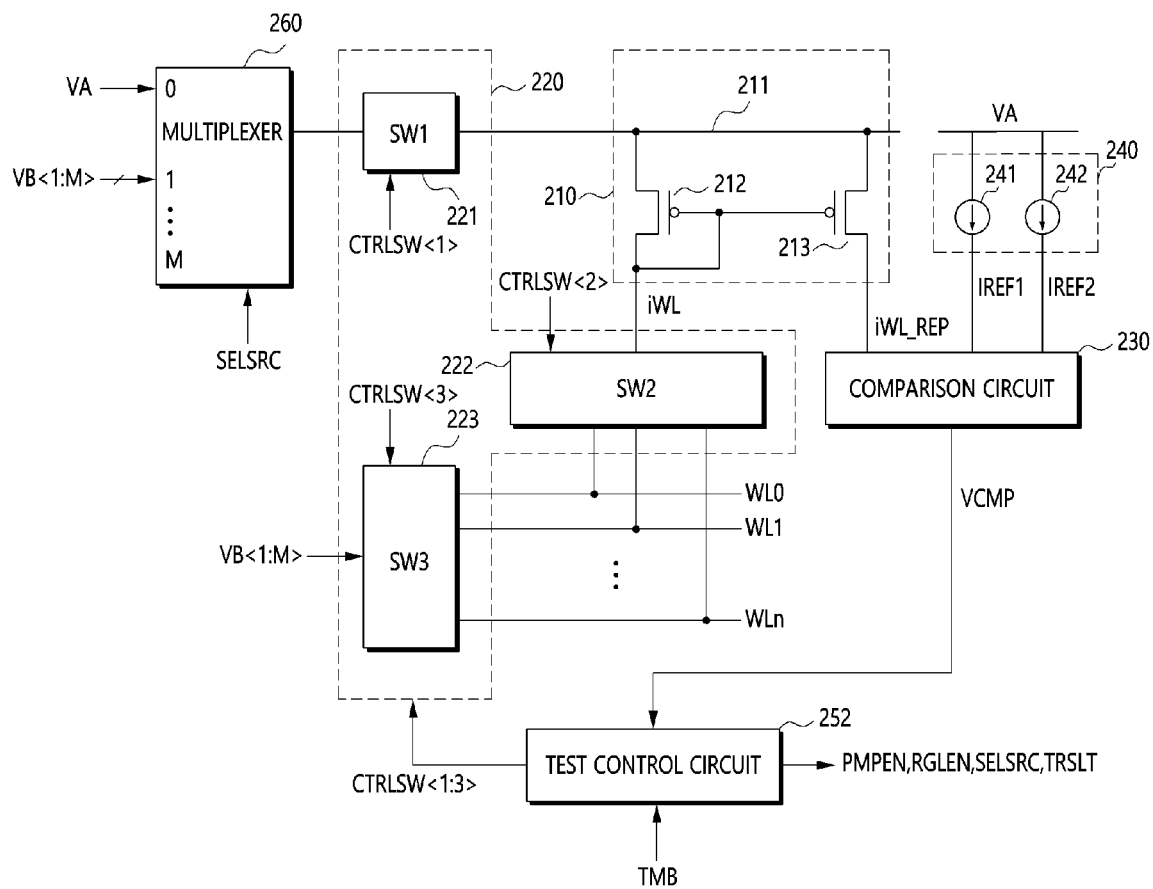
FIG. 5 is a diagram illustrating the configuration of a test circuit 202 in accordance with another embodiment of the present disclosure.

FIG. 5 is a diagram illustrating the configuration of a test circuit 202 in accordance with another embodiment of the present disclosure.

Referring to FIG. 5, the test circuit 202 may include a current mirror 210, a switching circuit 220, a comparison circuit 230, a reference current generator 240, a test control circuit 252, and a multiplexer 260.

Since the current mirror 210, the switching circuit 220, the comparison circuit 230, and the reference current generator 240 may be configured in the same manner as in FIG. 3, descriptions thereof will be omitted.

The multiplexer 260 may be configured to select one of the plurality of voltage sources, that is, the first voltage VA and the plurality of second voltages VB<1:M>, in response to a multiplexing control signal SELSRC and may be configured to output the selected voltage source to the current mirror 210. The multiplexing control signal SELSRC may have a value corresponding to any one of inputs 0 to M of the multiplexer 260 and may select and output an input corresponding to the value. For example, when the multiplexing control signal SELSRC has a value corresponding to '0', among the inputs 0 to M of the multiplexer 260, the first voltage VA may be selected, and when the multiplexing control signal SELSRC has a value corresponding to 'M', among the inputs 0 to M of the multiplexer 260, the second voltage VB<M> may be selected.

The test control circuit 252 may be configured to generate control signals to match the first noise control mode and the second noise control mode in response to the test mode signal TMB. The second noise control mode may be an operation that detects a voltage source having the least noise among the plurality of voltage sources and selects the detected voltage source as the test voltage. The control signals that are generated by the test control circuit 252 may include the plurality of switching control signals CTRLSW<1:3>, the charge pump enable signal PMPEN, the rectifier enable signal RGLEN, and the multiplexing control signal SELSRC. The test control circuit 252 may convert the comparison result signal VCMP into a data form and may output the converted signal as the test result signal TRSLT. The test control circuit 252 may be implemented as software and/or hardware including a time to digital converter TDC for converting the comparison result signal VCMP into a digital form.

Figure 6:
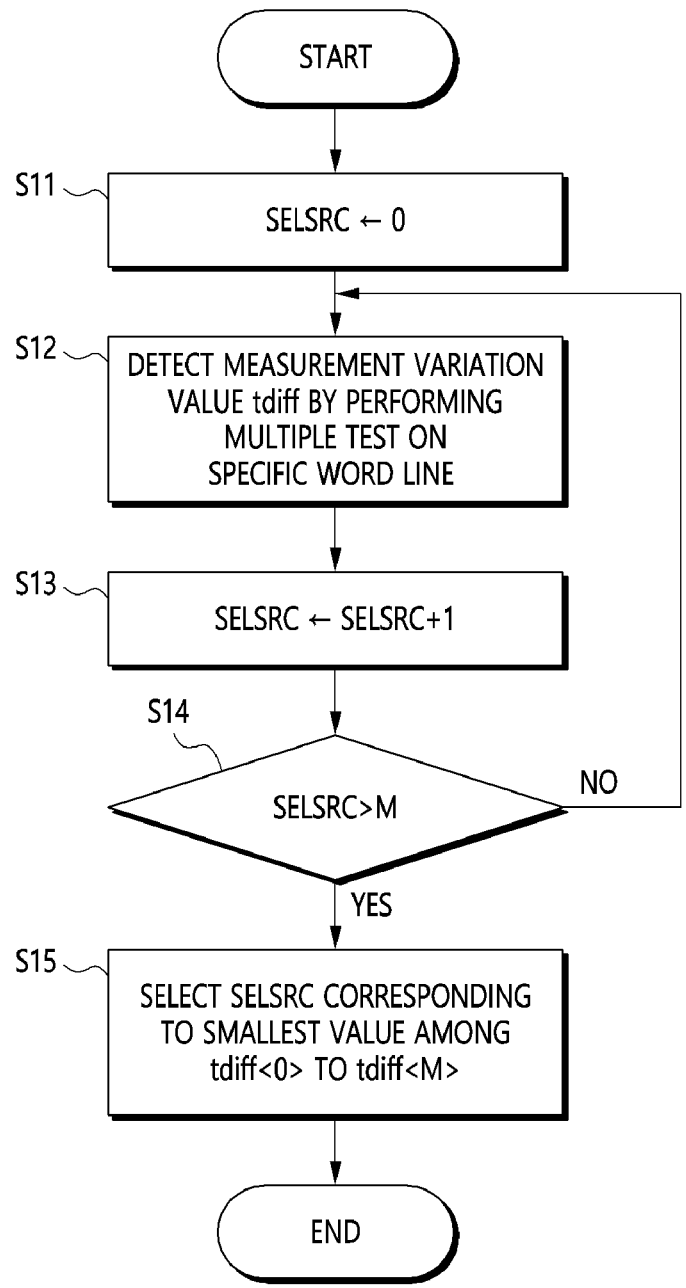
FIG. 6 is a flowchart illustrating a second noise control mode of the test circuit 202 in accordance with another embodiment of the present disclosure.

FIG. 6 is a flowchart illustrating the second noise control mode of the test circuit 202 in accordance with another embodiment of the present disclosure.

The second noise control mode may be an operation mode that detects a voltage source having the least noise among the plurality of voltage sources, and the second noise control mode will be described with reference to FIG. 6.

First, the first voltage VA may be selected as the test voltage by adjusting the value of the multiplexing control signal SELSRC so that any one of the inputs 0 to M of the multiplexer 260, for example, '0', which is the first sequential number, is selected (S11).

A measurement variation value tdiff may be detected by repeating a test on a specific word line, among a plurality of word lines WL0 to WLn, a set number of times by using the first voltage VA as the test voltage (S12).

In step S12, the period signal tMEAS may be generated whenever the test on the specific word line is performed once, and assuming that the number of test iterations is, for example, K+1 times, period signals tMEAS<0:K> may be finally generated. A difference between a maximum value and a minimum value, among the period signals tMEAS<0:K>, may be detected and stored as a measurement variation value tdiff<0>.

The second voltage VB<1> may be selected as the test voltage by increasing the value of the multiplexing control signal SELSRC so that '1', which is the next sequential number, is selected among the inputs 0 to M of the multiplexer 260 (S13).

It is determined whether the value of the multiplexing control signal SELSRC exceeds 'M' (S14).

As a result of the determination in step S14, when the value of the multiplexing control signal SELSRC is equal to or less than 'M', steps S12 and S13 may be repeated. As steps S12 and S13 are repeated, the measurement variation values tdiff<0:M> may be generated.

As a result of the determination in step S14, when the value of the multiplexing control signal SELSRC exceeds 'M', that is, when tests based on all of the plurality of voltage sources VA and VB<1:M> are completed, a value of the multiplexing control signal SELSRC corresponding to the smallest value, among the measured variation values tdiff<0:M>, may be selected (S15). Among the plurality of voltage sources VA and VB<1:M>, a voltage source corresponding to the value of the multiplexing control signal SELSRC that is selected through step S15 may be selected as a voltage source having the least noise. For example, when tdiff<0> is the smallest value, among the measured variation values tdiff<0:M>, the first voltage VA may be selected.

After the second noise control mode is performed through the above-described steps S11 to S15, an actual word line test including the first noise control mode may be performed by using the voltage source that is selected in the second noise control mode.

Figure 7:
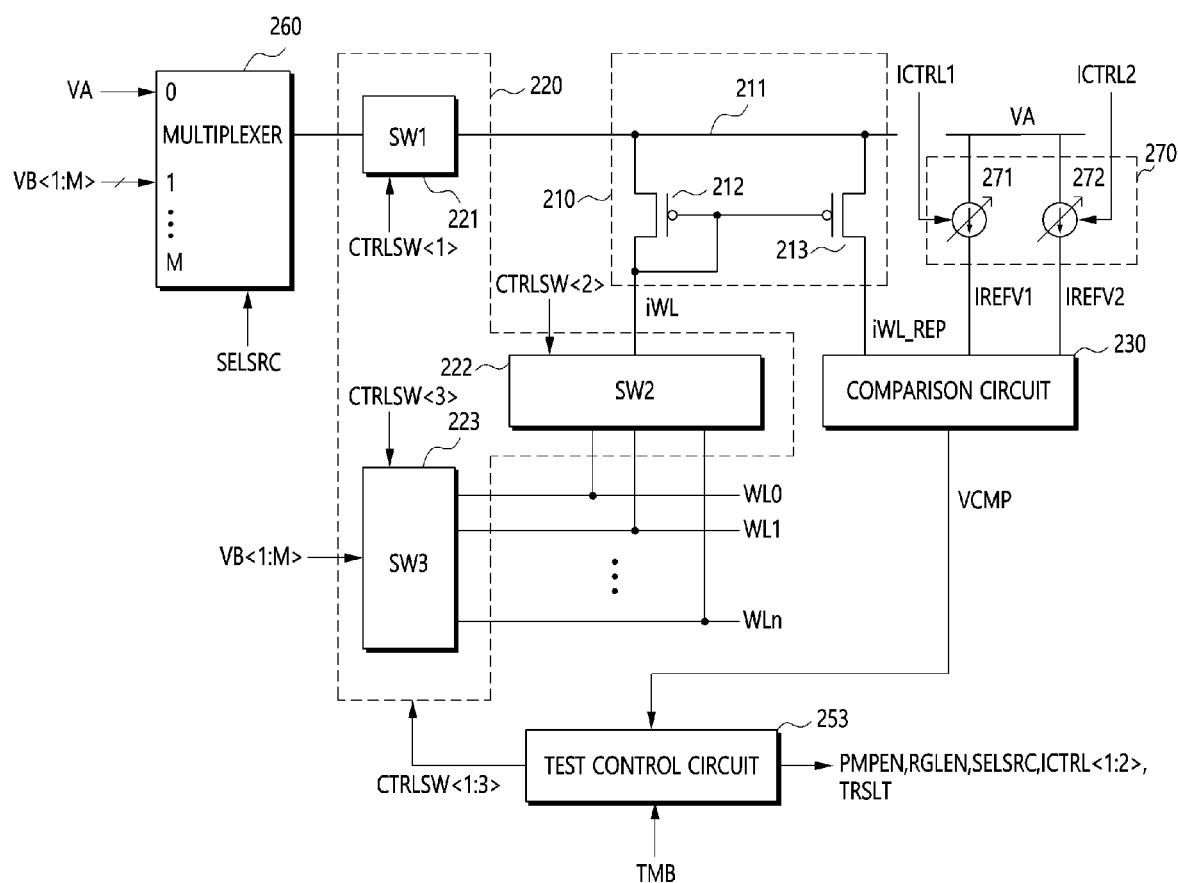
FIG. 7 is a diagram illustrating the configuration of a test circuit 203 in accordance with further another embodiment of the present disclosure.

FIG. 7 is a diagram illustrating the configuration of a test circuit 203 in accordance with further another embodiment of the present disclosure.

Referring to FIG. 7, the test circuit 203 may include a current mirror 210, a switching circuit 220, a comparison circuit 230, a reference current generator 270, a test control circuit 253, and a multiplexer 260.

Since the current mirror 210, the switching circuit 220, the comparator circuit 230, and the multiplexer 260 may be configured in the same manner as in FIG. 5, descriptions thereof will be omitted.

The reference current generator 270 may generate one or more variable reference currents, for example, a first variable reference current IREFV1 and a second variable reference current IREFV2 according to the first voltage VA, a first current control signal ICTRL1, and a second current control signal ICTRL2. The reference current generator 270 may include a first variable current source 271 and a second variable current source 272. The first variable current 1o source 271 may generate the first variable reference current IREFV1 according to the first voltage VA and the first current control signal ICTRL1. The first variable current source 271 may vary the amount of the first variable reference current IREFV1 according to the first current control signal ICTRL1. The second variable current source 272 may generate the second variable reference current IREFV2 according to the first voltage VA and the second current control signal ICTRL2. The second variable current source 272 may vary the amount of the second variable reference current IREFV2 according to the second current control signal ICTRL2.

The test control circuit 253 may be configured to generate control signals to match the first noise control mode, the second noise control mode, and the third noise control mode in response to the test mode signal TMB. The third noise control mode may be an operation that sets the amount of each of the reference currents, which are compared with a current that is generated by the test voltage, as a value with the least noise. The control signals that are generated by the test control circuit 253 may include the plurality of switching control signals CTRLSW<1:3>, the charge pump enable signal PMPEN, the rectifier enable signal RGLEN, the multiplexing control signal SELSRC, the first current control signal ICTRL1, and the second current control signal ICTRL2. The test control circuit 253 may convert the comparison result signal VCMP into a data form and output the converted signal as the test result signal TRSLT. The test control circuit 253 may be implemented as software and/or hardware including a time to digital converter TDC for converting the comparison result signal VCMP into a digital form.

Figure 8:
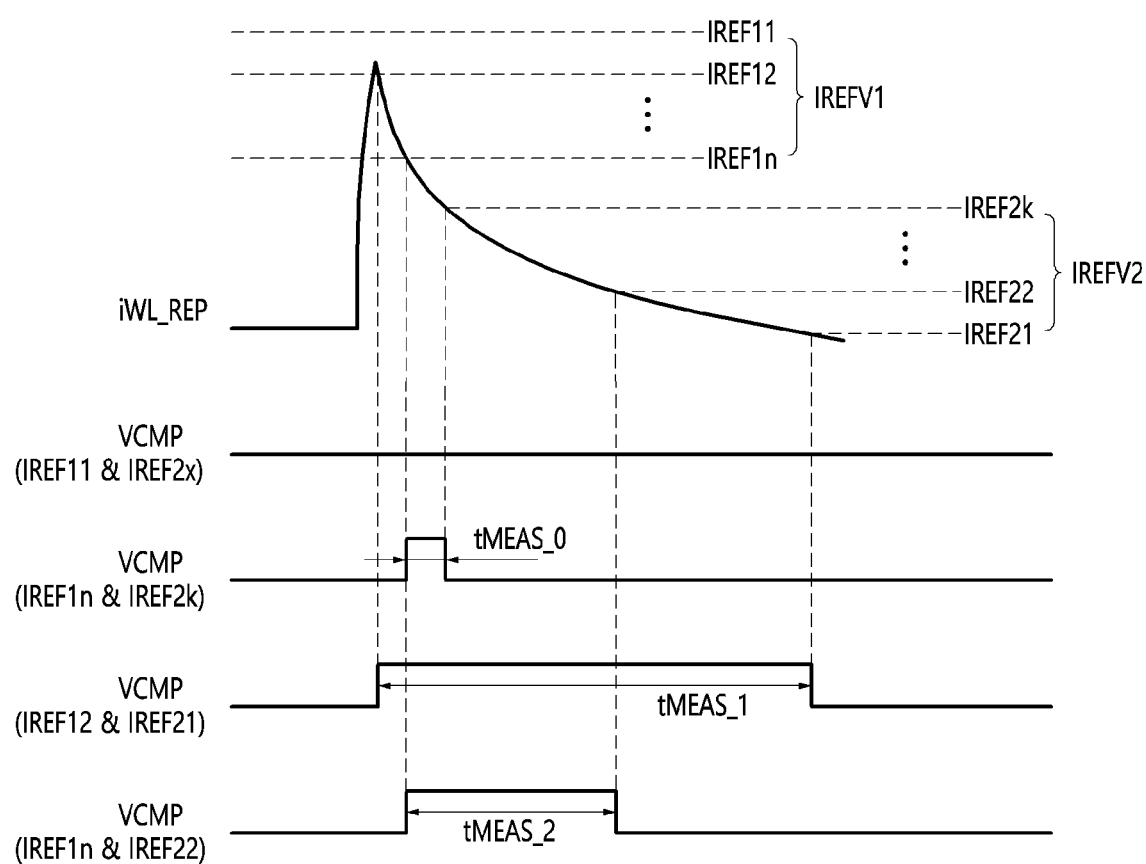
FIG. 8 is a timing diagram illustrating a change in a period signal according to a change in a reference current.

FIG. 8 is a timing diagram illustrating a change in a period signal in accordance with a change in reference current.

The background to which the third noise control mode is applied will be described with reference to FIG. 8.

The first variable reference current IREFV1 may vary between IREF11 to IREF1n, and the second variable reference current IREFV2 may vary between IREF21 to IREF2k which is a range that is lower than IREF1n.

For example, when the set first variable reference current IREFV1 and second variable reference current IREFV2 are IREF11 and IREF2x (2x is any one of 22 to 2k), IREF11 may exceed a maximum value of the copy current iWL_REP, resulting in a measurement failure in which the period signal tMEAS itself is not generated.

For another example, when the set first variable reference current IREFV1 and second variable reference current IREFV2 are IREF1n and IREF2k, a high level period of the period signal tMEAS becomes too short, and thus, the period signal tMEAS_0 may be determined as invalid noise.

For another example, when the set first variable reference current IREFV1 and second variable reference current IREFV2 are IREF12 and IREF21, a high level period of a period signal tMEAS_1 may become too long, and thus, a measurement time problem may occur, which may be recognized as noise.

When the set first variable reference current IREFV1 and second variable reference current IREFV2 are IREF1n and IREF22, the measurement sensitivity may be increased, and the copy current iWL_REP may be accurately detected, and thus, a high level period of a period signal tMEAS_2 may have an appropriate width.

As described above, when each of the first variable reference current IREFV1 and the second variable reference current IREFV2 is set as an appropriate value, an optimal test may be possible with noise being removed. Accordingly, in the embodiment of the present disclosure, the third noise control mode may be applied to set each of the first variable reference current IREFV1 and the second variable reference current IREFV2 as appropriate values.

Figure 9:
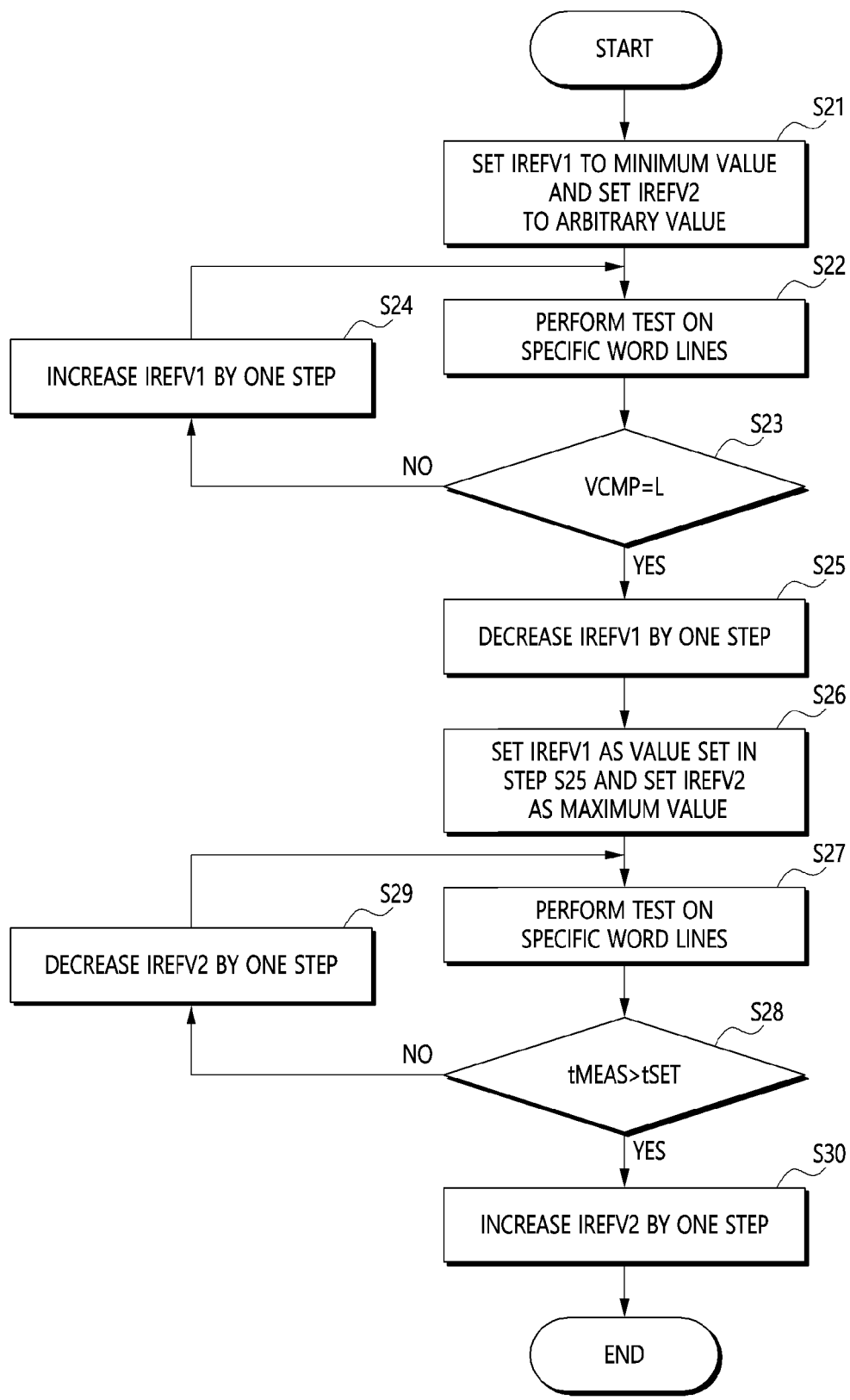
FIG. 9 is a flowchart illustrating a third noise control mode of the test circuit 203 in accordance with still another embodiment of the present disclosure.

FIG. 9 is a flowchart illustrating the third noise control mode of the test circuit 203 in accordance with still another embodiment of the present disclosure.

The reference current generator 270 may be controlled to set the first variable reference current IREFV1 as a minimum value and set the second variable reference current IREFV2 as an arbitrary value (S21).

A test may be performed on each of the plurality of word lines (S22). The test in step S22 may be performed in the same manner as the word line test, described with reference to FIG. 4. However, since it is a test for the third noise control mode, the result might not be used as a valid test result.

It may be determined whether the comparison result signal VCMP that is generated by performing step S22 is substantially maintained at a low level (S23).

As a result of the determination in step S23, when the comparison result signal VCMP transitions to a high level even once, the first variable reference current IREFV1 may be increased by one step (S24), and step S22 may be performed again. When the comparison result signal VCMP transitions to a high level even once according to the word line test, it may mean that the test result is determined to be a pass.

As a result of the determination in step S23, when the comparison result signal VCMP continues to be substantially maintained at a low level, the first variable reference current IREFV1 may be decreased by one step (S25). When the comparison result signal VCMP continues to be substantially maintained at a low level according to the word line test, it may mean that the test result is determined to be a fail. That is, since the finally varied first variable reference current IREFV1 exceeds a threshold for a pass determination and causes a fail determination, the first variable reference current IREFV1 may be readjusted to a value corresponding to the final pass determination time point.

An operation that sets the first variable reference current IREFV1 as an appropriate value may be performed in steps S21 to S25.

The reference current generator 270 may be controlled to set the first variable reference current IREFV1 as the value set in step S25 and may set the second variable reference current IREFV2 as a maximum value (S26).

A test may be performed on each of the plurality of word lines (S27). The test of step S27 may be performed in the same manner as the word line test, described with reference to FIG. 4. However, since it is a test for the third noise control mode, the result might not be used as a valid test result.

It may be determined whether the period signals tMEAS that are generated by performing step S27 exceed a set time tSET (S28).

As a result of the determination in step S27, when all the period signals tMEAS are equal to or less than the preset time tSET, the second variable reference current IREFV2 may be decreased by one step (S29), and step S27 may be performed again. When all the period signals tMEAS are equal to or less than the preset time tSET according to the word line test, it may mean that the test result is determined to be a pass.

As a result of the determination in step S27, when any one of the period signals tMEAS exceeds the set time tSET, the second variable reference current IREFV2 may be increased by one step (S30). When any one of the period signals tMEAS exceeds the set time tSET according to the word line test, it may mean that the test result is determined to be a fail. That is, since the finally varied second variable reference current IREFV2 exceeds the threshold for the pass determination and causes a fail determination, the second variable reference current IREFV2 may be readjusted to a value corresponding to the final pass determination time point.

An operation that sets the second variable reference current IREFV2 as an appropriate value may be performed in steps S26 to S30.

FIG. 9 is merely an example of an operation that sets the second variable reference current IREFV2 as an appropriate value after an operation that sets the first variable reference current IREFV1 as an appropriate value, and the operations may be performed in a reverse order.

After the third noise control mode is performed through the above-described steps S21 to S30, an actual word line test including the first noise control mode may be performed by using reference currents that are selected in the third noise control mode.

Figure 10:
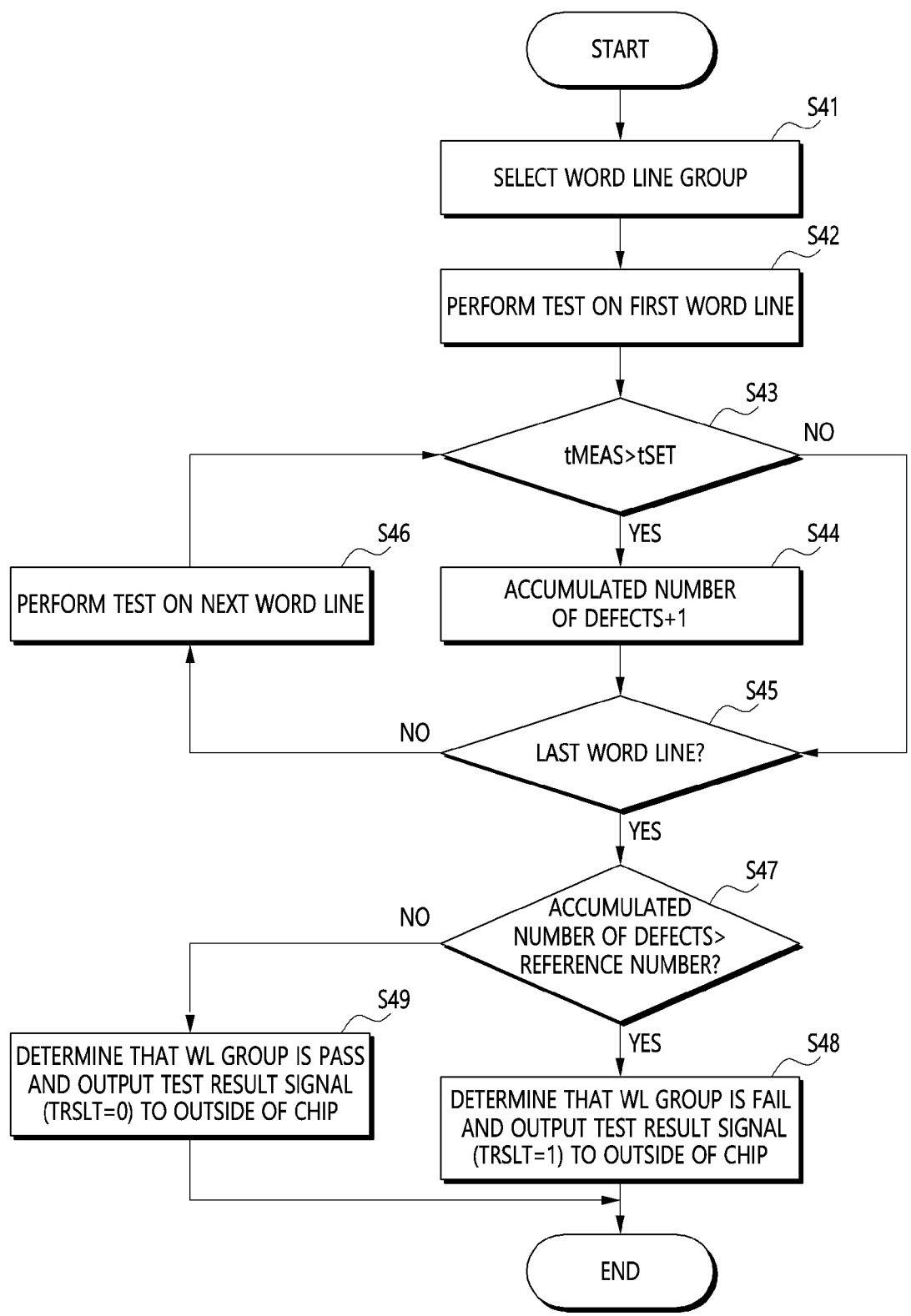
FIG. 10 is a flowchart illustrating a first test result output mode in accordance with embodiments of the present disclosure.

FIG. 10 is a flowchart illustrating the first test result output mode in accordance with embodiments of the present disclosure.

The first test result output mode may be performed by an operation that performs a word line test on a word line group that is selected from all word lines and outputs only a single-bit test result signal that defines a pass/fail for the word line group, which will be described with reference to FIG. 10.

A word line group including n word lines may be selected from all the word lines (S41).

A test may be performed on a first word line of the selected word line group (S42). The test of step S42 may be performed in the same manner as the word line test, described with reference to FIG. 4.

It may be determined whether a period signal tMEAS that is generated in step S42 exceeds the set time tSET (S43).

As a result of the determination in step S43, when the period signal tMEAS exceeds the set time tSET, that is, when the test result is determined to be a fail, the accumulated number of defects may be increased by '1' (S44).

As a result of the determination in step S43, when the period signal tMEAS is equal to or less than the set time tSET, that is, when the test result is determined to be a pass, it may be determined whether the word line that is tested in step S42 is a last word line (S45).

As a result of the determination in step S45, when the word line that is tested in step S42 is not the last word line, a next word line may be tested (S46), and the procedure may return to step S43.

As a result of the determination in step S45, when the word line that is tested in step S42 is the last word line, it may be determined whether the accumulated number of defects up to now exceeds a preset reference number (S47).

As a result of the determination in step S47, when the accumulated number of defects exceeds the preset reference number, the word line group may be determined to be a fail, and a single-bit test result signal TRSLT having a value of '1', indicating a fail, may be output to an external device, outside of a chip (S48).

As a result of the determination in step S47, when the accumulated number of defects is equal to or less than the preset reference number, the word line group may be determined to be a pass, and a single-bit test result signal TRSLT having a value of '0', indicating a pass, may be output to an external device, outside of the chip (S49).

By performing step S48 or step S49, the first test result output mode may be ended.

FIG. 11 is a flowchart illustrating the second test result output mode in accordance with embodiments of the present disclosure.

The second test result output mode may be performed by an operation that performs a word line test on all the word lines and outputs only a single-bit test result signal that defines a pass/fail for each word line, which will be described with reference to FIG. 11.

A word line group including n word lines may be selected from all the word lines (S51).

A test may be performed on a first word line of the selected word line group (S52). The test of step S52 may be performed in the same manner as the word line test, described with reference to FIG. 4.

It may be determined whether a period signal tMEAS that is generated in step S52 exceeds the set time tSET (S53).

As a result of the determination in step S53, when the period signal tMEAS exceeds the set time tSET, the corresponding word line may be determined to be a fail, and a single-bit test result signal TRSLT having a value of '1', indicating a fail, may be output to an external device, outside of the chip (S54).

As a result of the determination in step S53, when the period signal tMEAS is equal to or less than the set time tSET, the corresponding word line may be determined to be a pass, and a single-bit test result signal TRSLT having a value of '0', indicating a pass, may be output to an external device, outside of the chip (S55).

After the steps S54 and S55 are performed, it may be determined whether the tested word line is a last word line (S56).

As a result of the determination in step S56, when the tested word line is not the last word line, a next word line may be tested (557), and the procedure may return to step S53.

As a result of the determination in step S56, when the tested word line is the last word line, the second test result output mode may be ended.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. A word line test circuit comprising:
a current mirror configured to apply a test current that is generated by a test voltage to a selected word line, among a plurality of word lines, and to generate a copy current by copying the test current;
a comparison circuit configured to compare at least one reference current with the copy current to generate a comparison result signal; and
a test control circuit configured to perform a first noise control mode that charges unselected word lines, among the plurality of word lines, with electric charges, in response to a test mode signal and floats the unselected word lines,
wherein the test control circuit is configured to further perform a second noise control mode that detects a voltage source having the least noise among a plurality of voltage sources by performing a test on any one of the plurality of word lines a plurality of times and configured to select the detected voltage source as the test voltage.

2. The word line test circuit according to claim 1, wherein the test control circuit is configured to apply the test voltage to the current mirror after performing the first noise control mode.

3. The word line test circuit according to claim 1, further comprising:
a switching circuit connected between a plurality of voltage sources, the current mirror, and the plurality of word lines and configured to operate in response to a plurality of switching control signals that are generated by the test control circuit.

4. The word line test circuit according to claim 3, wherein the switching circuit comprises:
a first switching unit configured to apply the test voltage to the current mirror in response to a first switching control signal;
a second switching unit configured to apply the test current to the selected word line in response to a second switching control signal; and
a third switching unit configured to apply a predetermined voltage to the unselected word lines in response to an activation of a third switching control signal and configured to float the unselected word lines in response to a deactivation of the third switching control signal.

5. The word line test circuit according to claim 1, further comprising:
a reference current generator configured to generate the at least one reference current according to any one of a plurality of voltage sources.

6. The word line test circuit according to claim 1, further comprising:
a multiplexer configured to select one of the plurality of voltage sources in response to a multiplexing control signal that is generated by the test control circuit and configured to output the selected voltage source to the current mirror as the test voltage.

7. The word line test circuit according to claim 1, wherein the test control circuit is configured to further perform a third noise control mode that performs a test on the plurality of word lines a plurality of times and sets an amount of the at least one reference current as a value having the least noise.

8. The word line test circuit according to claim 7, further comprising:
a first variable current source configured to generate a first variable reference current in response to a first current control signal that is generated by the test control circuit; and
a second variable current source configured to generate a second variable reference current in response to a second current control signal that is generated by the test control circuit.

9. The word line test circuit according to claim 1, wherein the test control circuit is configured to perform a first test result output mode that performs a word line test on a word line group that is selected from the plurality of word lines and outputs a single-bit test result signal that defines a pass/fail for the word line group.

10. The word line test circuit according to claim 1, wherein the test control circuit is configured to perform a second test result output mode that performs a word line test on the plurality of word lines and outputs a single-bit test result signal that defines a pass/fail for each of the plurality of word lines.

11. A semiconductor apparatus comprising:
a memory cell array;
an address decoder connected to the memory cell array through a plurality of word lines and configured to selectively activate the plurality of word lines according to an address signal;
a voltage generator configured to generate a plurality of source voltages for an operation of the semiconductor apparatus; and
a test circuit configured to perform a word line test that compares a first reference current and a second reference current with a copy current that is generated by applying a test current that is generated by a test voltage to a selected word line, among the plurality of word lines, and configured to perform at least one of a first noise control mode, a second noise control mode, a third noise control mode, a first test result output mode, and a second test result output mode during the word line test,
wherein the second noise control mode includes an operation that detects a voltage source having the least noise among the plurality of voltage sources and selects the detected voltage source as the test voltage.

12. The semiconductor apparatus according to claim 11, wherein the first noise control mode includes an operation that charges unselected word lines, which are adjacent to selected word lines, among the plurality of word lines, with electric charges, and floats the unselected word lines.

13. The semiconductor apparatus according to claim 12, wherein the test circuit is configured to deactivate the voltage generator after charging the unselected word lines with electric charges.

14. The semiconductor apparatus according to claim 11, wherein the test circuit is configured to perform the second noise control mode by repeating a test on any one of the plurality of word lines based on each of the plurality of voltage sources a preset number of times to detect measurement variation values, detecting a voltage source corresponding to the smallest one of the detected measurement variation values, and selecting the detected voltage source as the test voltage.

15. The semiconductor apparatus according to claim 11, wherein the third noise control mode includes an operation that sets an amount of each of the first reference current and the second reference current as a value with the least noise.

16. The semiconductor apparatus according to claim 15, wherein the test circuit is configured to perform the third noise control mode that sets an amount of the first reference current as an amount of current at the time of final pass determination when a fail occurs as a result of performing a test on some of the plurality of word lines while varying the amount of the first reference current in a state in which the second reference current is set as an arbitrary value and sets an amount of the second reference current as the amount of current at the time of final pass determination when a fail occurs as a result of performing a test on some of the plurality of word lines while varying the amount of the second reference current in a state in which the first reference current is set as an arbitrary value.

17. The semiconductor apparatus according to claim 11, wherein the test circuit is configured to perform the first test result output mode that performs a test on a word line group that is selected from the plurality of word lines and outputs a single-bit test result signal that defines a pass/fail for the word line group to an external device.

18. The semiconductor apparatus according to claim 11, wherein the test circuit is configured to perform the second test result output mode that performs a test on a word line group that is selected from the plurality of word lines and outputs only a single-bit test result signal that defines a pass/fail for each word line included in the word line group to an external device.

19. The semiconductor apparatus according to claim 11, wherein the test circuit comprises:
a current mirror configured to apply the test current that is generated by the test voltage to the selected word line and to generate the copy current by copying the test current;
a multiplexer configured to select one of the plurality of voltage sources and output the selected voltage source to the current mirror;
a reference current generator configured to generate the first reference current and the second reference current;
a comparison circuit configured to generate a comparison result signal by comparing the copy current with the first reference current and the second reference current;
a switching circuit connected between the plurality of voltage sources, the current mirror, and the plurality of word lines; and
a test control circuit configured to control the multiplexer, the reference current generator, and the switching circuit to match at least one of the word line test, the first noise control mode, the second noise control mode, the third noise control mode, the first test result output mode, and the second test result output mode in response to a test mode signal.

* * * * *